United States Patent [19]

Roberts

[11] 4,195,252

[45] Mar. 25, 1980

[54] ZERO DELAY TRIGGER VIEW

[75] Inventor: Ronald W. Roberts, Cornelius, Oreg.

[73] Assignee: Tektronix, Inc., Beaverton, Oreg.

[21] Appl. No.: 961,437

[22] Filed: Nov. 16, 1978

[51] Int. Cl.² .......................................... G01R 13/28
[52] U.S. Cl. ................................ 315/392; 324/121 R
[58] Field of Search ...................... 315/392, 394, 395; 324/121

[56] References Cited

U.S. PATENT DOCUMENTS 3,795,834  3/1974  Andrews et al. ..................... 315/392
3,971,011  7/1976  Borchert ............................. 315/392

Primary Examiner—Theodore M. Blum
Attorney, Agent, or Firm—George T. Noe

[57] ABSTRACT

An apparent zero delay of a trigger view signal with respect to a normal vertical signal in an oscilloscope is provided by horizontally shifting the trigger view display to coincide with the normal vertical display. This is achieved by injecting a predetermined offset current into the sweep sawtooth output amplifier only when the trigger view signal is being displayed.

7 Claims, 3 Drawing Figures

ZERO DELAY TRIGGER VIEW

BACKGROUND OF THE INVENTION

It has become a common practice to provide for some models of oscilloscopes an additional amplifier channel to provide the display of an external triggering signal as an additional viewing mode known as Trigger View. Generally, a sample of the external triggering signal is picked off at the trigger preamplifier or trigger comparator stage, amplified to a suitable level, and made available as a trigger view signal via a vertical display mode switch to the vertical deflection amplifier. Because the vertical and horizontal circuits of an oscilloscope are physically separated from each other, the trigger view signal path is necessarily a longer physical length than a normal vertical amplifier channel. This doesn't present a problem when the trigger view signal is the only signal displayed; however, a problem does become apparent when the trigger view signal is alternated with a signal processed by the normal vertical channel because the longer signal path length of the trigger view signal results in an approximate four nanosecond delay of the trigger view signal with respect to the normal vertical signal. In high-speed applications, for example, where the sweep timing is two nanoseconds per division, this effective delay is two full graticule divisions, rendering any timing comparisons impractical.

Heretofore suggested solutions to the problem addressed hereinabove have either been inadequate or have produced other problems. For example, designing the trigger view amplifier channel with a physical and electrical layout the same as the normal vertical channel is unnecessarily expensive, requiring unneeded parts and consuming circuit board space. It has been suggested to lengthen the normal vertical amplifier delay to match the trigger view channel delay; however, this proposed solution results in increased bulk, particularly where the normal vertical amplifier comprises matched channel 1 and channel 2 dual amplifiers, and further, lengthening the normal vertical amplifier channel delay may lead to electrical problems associated therewith. Another alternative, delaying the start of the sweep associated with the trigger view display, results in jitter and other timing and triggering problems.

The concept of trigger view is intended primarily as an ancillary oscilloscope feature for user convenience, and therefore economies of the situation dictate that problems associated therewith should not dominate instrument design to the detriment of other signal processing circuits or oscilloscope operating functions.

SUMMARY OF THE INVENTION

According to the present invention, an apparent zero delay of a trigger view signal with respect to a normal vertical signal in an oscilloscope is provided by horizontally shifting the trigger view display to coincide with the normal vertical display. This is achieved by injecting a predetermined offset current into the sweep sawtooth output amplifier only when the trigger view signal is being displayed.

In a preferred embodiment, a plurality of offset-current-setting resistors are ganged with the sweep rate switch to provide the necessary offset current for those sweep rates at which a delay would be apparent, e.g., rates of 200 nanoseconds per division and faster. Logic circuitry is provided to enable the offset only when required to produce the resultant zero delay of the trigger view signal with respect to the normal vertical signal. The zero delay trigger view may be implemented in a full dual amplifier channel, dual sweep oscilloscope wherein the trigger view channel may be selectively displayed with either the A or B sweep in any of several vertical display modes, including Channel 1, Channel 2, or ADD.

It is therefore one object of the invention to provide a zero delay trigger view circuit to provide an apparent timing match between trigger view amplifier and normal vertical amplifier channels at all sweep rates of an oscilloscope.

It is another object to provide a zero delay trigger view circuit which apparently eliminates delay by horizontally shifting the display of a delayed signal to an undelayed position.

It is a further object to provide a zero delay trigger view circuit which is compatible to dual amplifier channel, dual sweep oscilloscopes.

It is an additional object to provide a zero delay trigger view circuit which is simple, inexpensive, and does not operate to the detriment of other oscilloscope circuits or operating functions.

Other objects and attainments of the present invention will become apparent to those skilled in the art upon a reading of the following detailed description when taken in conjunction with the drawings.

DRAWINGS

DETAILED DESCRIPTION OF THE INVENTION

Figure 1:
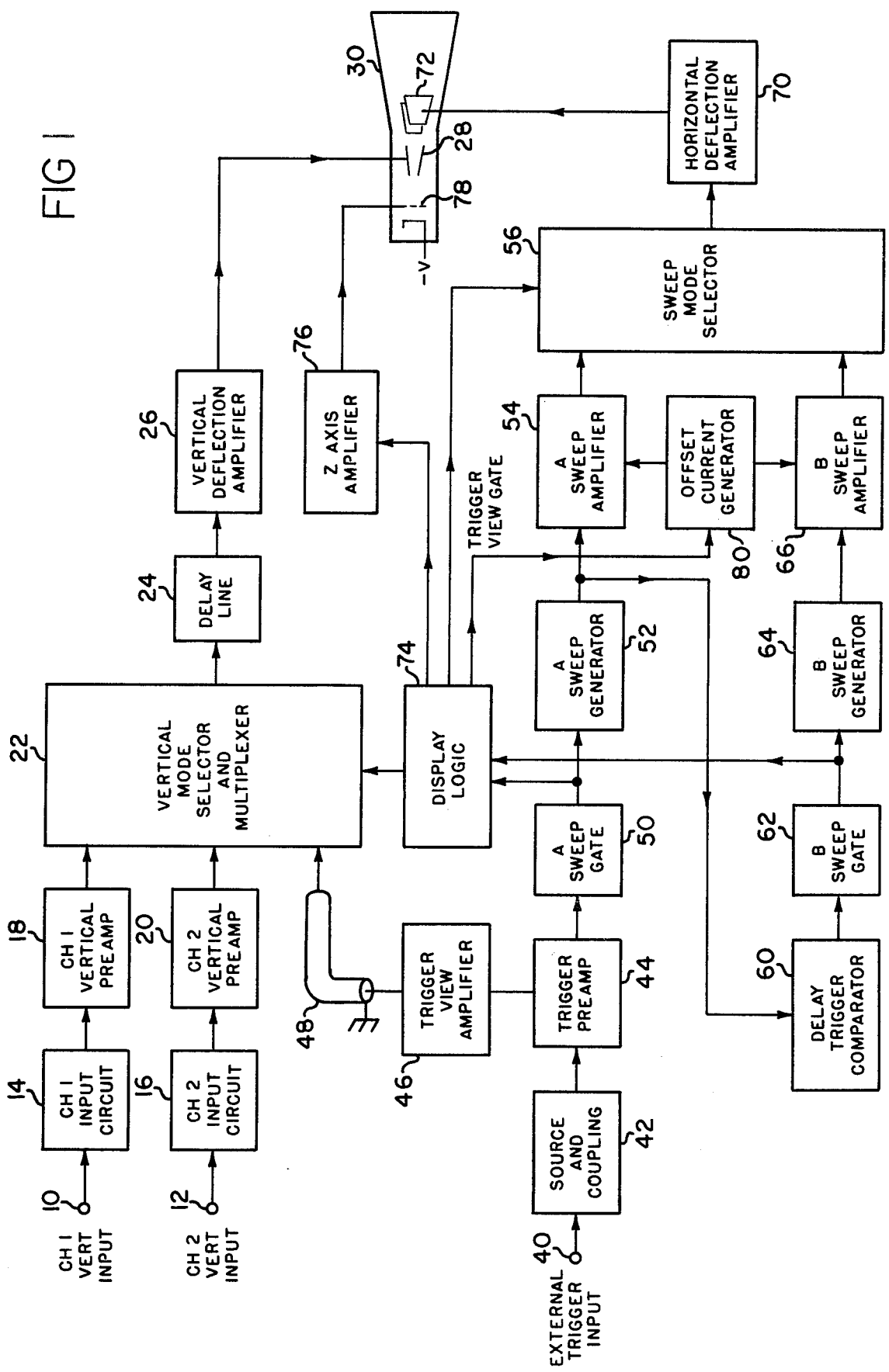
FIG. 1 shows a simplified block diagram of an oscilloscope in which the relationship of the present invention to the conventional circuits is shown.

Referring to FIG. 1, the block diagram of an oscilloscope embodying the present invention is shown. While a dual channel, dual sweep oscilloscope is shown, the principles of zero delay trigger view will apply to single channel, single sweep oscilloscopes as well. An input signal may be applied to either the Channel 1 (CH 1) or Channel 2 (CH 2) vertical input 10 or 12 respectively. Input circuit 14 or 16 provides correct attenuation and coupling, then the signal receives its first amplification and is split into a push-pull, or differential signal by vertical preamplifier 18 or 20. Preamplifiers 18 and 20 generally include gain switching to provide a plurality of vertical deflection factors. A vertical mode selector and multiplexer 22 is provided to establish the display viewing mode of operation and to select the channel to be displayed. The vertical signal is passed through a delay line 24, which provides a predetermined delay of the display vertical information to allow time for sweep activation in the case of internal triggering, thus ensuring no loss of the display information. The signal receives a final amplification by vertical deflection amplifier 26 and is then applied to vertical deflection plate 28 of a cathode-ray tube 30.

Typically, the sweep circuits may be triggered from internal, power line, or external signal sources; however, for this discussion, external triggering will be assumed because this is the signal of interest in the trigger view mode. The external triggering signal is applied via an input terminal 40 and source and coupling switches 42 to a trigger preamplifier 44. Generally, trigger preamplifier 44 is a comparator which generates a sweep trigger when the trigger signal passes through a predetermined reference level. A sample of the triggering signal is picked off and applied to a trigger view amplifier 46, where it is amplified to a suitable level. The output of the trigger view amplifier 46 is routed through a cable 48 to the vertical mode selector and multiplexer 22, where it may be selected for display.

Upon receipt of a sweep trigger from trigger preamplifier 44, the A sweep gate circuit 50 generates a gating signal to turn on the A sweep generator 52 to produce an A sweep sawtooth signal. This sawtooth signal is amplified by A sweep amplifier 54 and made available to the sweep mode selector 56. The A sweep sawtooth signal from A sweep generator 52 is also applied to a delay trigger comparator 60 where it is compared with a selectable precise reference level to generate a B sweep trigger a precise time delay after initiation of the A sweep. Upon receipt of the B sweep trigger, the B sweep gate circuit 62 generates a gating signal to turn on the B sweep generator 64 to produce a B sweep sawtooth, which is then amplified by B sweep amplifier 66 and made available to the sweep mode selector 56. In most conventional oscilloscopes, sweep gates 50 and 62 are bistable multivibrators, and sweep generators 52 and 64 are Miller integrators. In the so-called delayed sweep mode, the B sweep is generally operated at a higher sweep rate than A sweep, allowing an operator to pick out an area of interest along the A sweep display and magnify this area using the B sweep. Both the A and B sweep generators are provided with a plurality of selectable timing circuits to provide a plurality of selectable sweep rates. The sweep mode selector 56 selects either the A or B sweep signal, which is split into a differential signal and amplified by horizontal deflection amplifier 70 to levels suitable to drive horizontal deflection plates 72 in a linear fashion.

The A and B sweep gate signals are also applied to a display logic control circuit 74, which generates a plurality of control signals to coordinate the vertical and horizontal deflection signals in the various display modes. The control signals are derived from the sweep gates in the conventional manner. The display logic circuit 74 also provides gating signals to the Z-axis amplifier 76, which controls the cathode-ray tube control grid 78, to blank the display during sweep retrace or flyback periods, and to provide display intensification during sweeps, particularly to provide an intensification of a B sweep segment of an A sweep display, i.e., the conventional A intensified by B sweep mode.

At this point, the principle of zero delay trigger view can best be understood by way of example. Assume that a particular repetitive signal having a frequency of 100 magahertz (period of 10 nanoseconds) is applied to both CH 1 normal vertical input 10 and the external trigger input 40, and that the vertical mode selector 22 is set to alternate between the CH 1 amplifier channel 18 and the trigger view amplifier 46. Further assume that the selected A sweep rate is 20 nanoseconds per division (two cycles of display per graticule division where the sweep length is 10 divisions), that the selected B sweep rate is two nanoseconds per division, effecting a ten times magnification of the horizontal display, and that the B sweep is selected by the sweep mode selector 56 so that two complete cycles of the input signal are displayed. Because of the approximate four nanosecond delay of the trigger view amplifier signal with respect to the normal vertical signal imposed by the cable 48, the alternating display of the two signals is such that they do not coincide; that is, the trigger view signal display is shifted two graticule divisions to the right of the normal vertical signal. Signal coincidence, or zero delay, under the conditions hereinabove described is effected by shifting the trigger view display horizontally by the appropriate amount to cause the desired coincidence. This is achieved as follows.

The display logic circuit 74 additionally generates a trigger view gate coincident with whichever sweep is selected to display the trigger view signal, which trigger view gate is utilized to enable the offset current generator 80. The offset current generator 80 injects a predetermined offset current into the appropriate sweep amplifier 54 or 66 during the trigger view gate period to cause a predetermined voltage shift of the sweep sawtooth voltage, and, consequently, to cause a corresponding horizontal shift of the entire trigger view display to provide an apparent zero delay of the trigger view signal.

Figure 2:
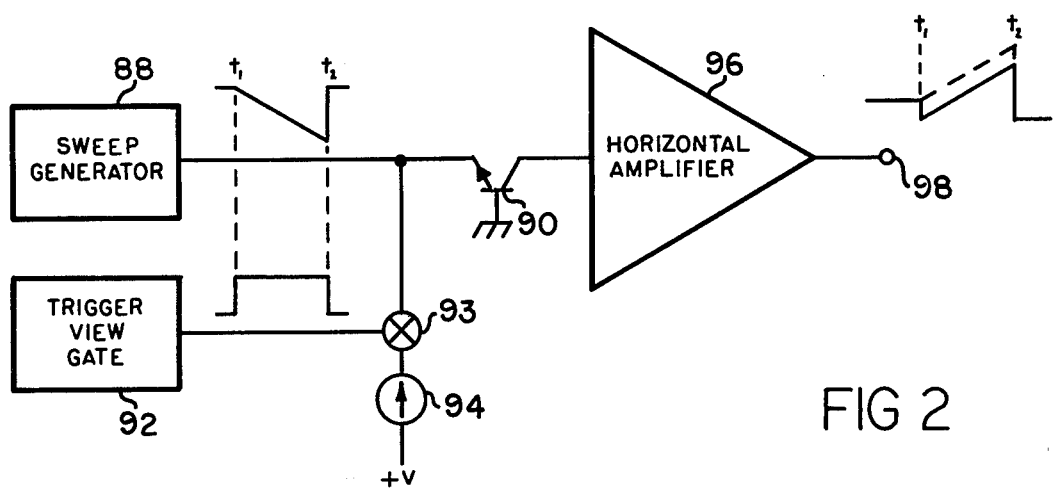
FIG. 2 shows a simplified schematic of a zero delay trigger view circuit in accordance with the present invention.

A simplified schematic of a zero delay trigger view circuit is shown in FIG. 2. A sweep generator 88 produces a negative-going sawtooth current of predetermined magnitude which is started at a time $t_1$ and terminated at a time $t_2$. This sweep sawtooth is applied to the emitter of a grounded-base transistor 90. A trigger view gate generator produces a gate signal whose rising and falling edges coincide with the sweep start and stop at times $t_1$ and $t_2$ respectively. This gate signal is applied to a switch 93, which connects a current source 94 into the emitter circuit of transistor 90. The output of transistor 90 is inverted and amplified by a horizontal amplifier 96, producing a positive-going sawtooth at output terminal 98. In the absence of a trigger view gate signal, the output sawtooth would rise from its base line, following the dashed line shown in FIG. 2. However, the current from current source 94 injected into the emitter of transistor 90 produces a downward shift in the output voltage at time $t_1$, resulting in a shift of the entire sawtooth signal. At time $t_2$, current source 94 is switched off by switch 93, so that the output voltage returns to its quiescent baseline to await the start of a new sweep. The shift in the output sawtooth voltage results in a horizontal shift to the left of the display. The amount of horizontal shift is determined by the current from current source 94.

Figure 3:
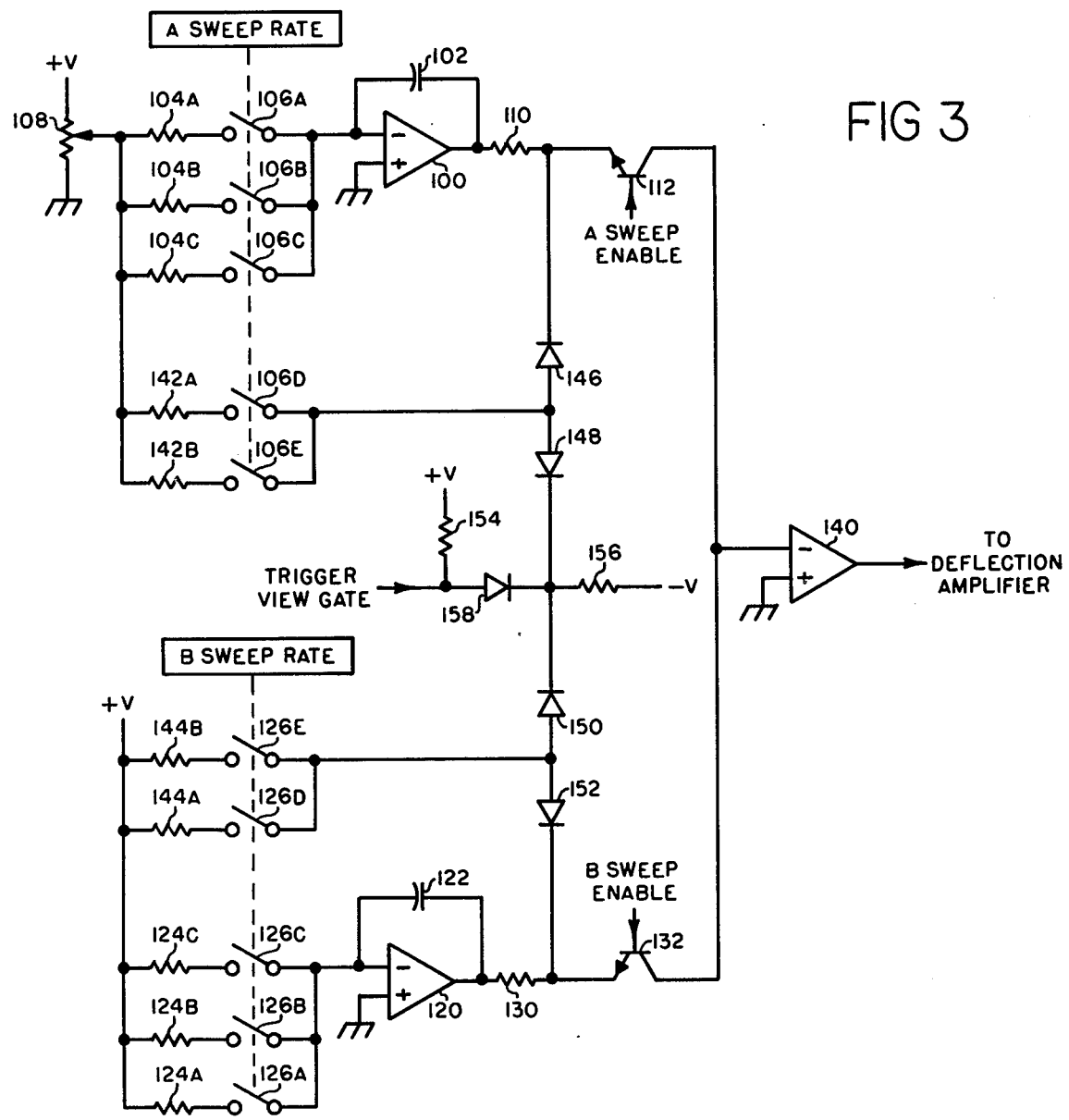
FIG. 3 shows a schematic of a dual-sweep implementation of the offset current generating portion of the present invention.

A schematic of a dual-sweep implementation of the zero delay trigger view circuit is shown in FIG. 3. Here the A sweep generator comprises a Miller integrator consisting of amplifier 100, feedback timing capacitor 102, and a plurality of timing resistors 104A-C which are selectable by an A sweep rate switch 106A-E. A potentiometer 108, connected between a suitable source of positive voltage and ground, provides a variable timing current; however, for fixed calibrated sweep rates, the resistors 104A-C are connected to the positive voltage supply. The output of the A sweep generator is fed through a resistor 110 to the emitter of transistor 112.

Similarly, the B sweep generator comprises a Miller integrator consisting of amplifier 120, feedback timing capacitor 122, and a plurality of timing resistors 124A-C which are selectable by a B sweep rate switch 126A-E. The resistors 124A-C are connected to the positive voltage supply and provide a plurality of calibrated sweep rates. The output of the B sweep generator is fed through a resistor 130 to the emitter of transistor 132. For simplicity, sweep gate generators are not shown; however, it should be understood that such gate generators as shown in FIG. 1 would be included in an actual oscilloscope embodiment.

Logic enable-disable signals are applied to the bases of transistors 112 and 132 to effect the sweep mode selection. These signals may be derived from the sweep gates or from switch logic. The collectors of transistors 112 and 132 are connected together to the input of a buffer amplifier 140 through which the selected sweep sawtooth signal is passed.

The offset current generators and trigger view gating networks are connected to the emitter circuits of transistors 112 and 132. Resistors 142A and 142B provide selectable predetermined currents to be injected into the emitter of transistor 112, while resistors 144A and 144B provide selectable predetermined currents to be injected into the emitter of transistor 132. The resistors 142 and 144 are ganged respectively to the A and B sweep rate switches so that they are selected in only predetermined switch positions. Steering diodes 146, 148, 150, and 152 are provided to ensure that the offset current is injected into the transistor emitters only during trigger view. A voltage divider comprising resistors 154 and 156 and diode 158 connected between suitable positive and negative voltage supplies maintains diodes 146 and 152 in a normally reversed bias condition. Upon application of a positive-going trigger view gate signal to the junction of resistor 154 and diode 158, diodes 148 and 150 become reversed biased, permitting forward biasing of diodes 146 and 152. Of course, the forward biasing of diodes 146 or 152 depends upon the connection of a resistor 142 or 144 into the circuit, and as mentioned previously, if the selected sweep rate is low enough that observed delay of the trigger view signal cannot be detected by the eye, no correction is necessary, so no offset current will be generated even though the trigger view gate signal is applied.

In summary, a zero delay trigger view circuit has been shown and described in which an apparent zero delay of a trigger view signal with respect to a normal vertical signal in an oscilloscope is provided by horizontally shifting the trigger view display to coincide with the normal vertical display.

It will be obvious to those skilled in the art that many changes may be made in the details of the hereinabove described preferred embodiment of the present invention without departing from the spirit of the invention. For example, an offset current could be injected into the timing circuits of the Miller integrator to shift the sweep start voltage. Also, while the invention was developed to provide a zero delay trigger view, the foregoing principles may be applied in any situation where zero delay or delay matching is desired.

What I claim as being novel is:

1. In an oscillographic device having vertical and horizontal deflection systems, a circuit for providing an apparent time shift of a preselected waveform display, comprising:
    a sweep generator for generating a sweep sawtooth signal the width of which is substantially coincident with the time interval of said waveform display;
    means for generating a gate signal the gate width of which is substantially coincident with the time interval of said waveform display;
    means coupled to said gate signal generating means for generating a predetermined offset current during the time interval that said gate signal is generated;
    means for combining said sweep sawtooth signal and said offset current to produce a sawtooth voltage the level of which is shifted by a predetermined level; and
    means for coupling said sawtooth voltage to said horizontal deflection system.

2. A circuit in accordance with claim 1 wherein said offset current generating means includes a plurality of selectable current sources.

3. A circuit in accordance with claim 2 wherein said sweep generator includes sweep rate selecting means, said sweep rate selecting means also selecting said selectable current sources to provide the same apparent time shift for a plurality of sweep rates.

4. In an oscilloscope having at least a first and a second amplifier channel associated with the vertical deflection system thereof, a circuit for providing apparent time coincidence of display signals processed by both said amplifier channels wherein said second amplifier has a longer signal path than said first amplifier channel, comprising:
    means for generating sweep sawtooth signals to provide horizontal deflection of said display signals;
    offset current generating means for selectively generating predetermined offset current only during the display of signals processed by said second amplifier channel; and
    means for combining said offset current with ones of said sawtooth signals to provide a horizontal deflection sawtooth signal the level of which is shifted by a predetermined amount.

5. A circuit in accordance with claim 4 wherein said offset current generating means includes at least one current source which is rendered operable at a predetermined selectable sweep rate of said sweep generating means.

6. A circuit in accordance with claim 4 further including a display logic unit for providing control signals to selectively display signals processed by said first and second amplifier channels, said display logic unit further providing a control signal to enable said offset current generating means coincident with the display of signals processed by said second amplifier channel.

7. A circuit in accordance with claim 6 wherein said sweep generating means includes first and second sweep generators, and display logic unit further provides a control signal to select a horizontal deflection sawtooth signal from either of said first and second sweep generators.

* * * * *